United States Patent [19]

Dilay et al.

[11] 3,768,548

[45] Oct. 30, 1973

[54] COOLING APPARATUS FOR SEMICONDUCTOR DEVICES

[75] Inventors: Walter Dilay, Dearborn; Edward J. Zulinski, Berkley, both of Mich.

[73] Assignee: Ford Motor Company, Dearborn, Mich.

[22] Filed: Mar. 2, 1972

[21] Appl. No.: 231,300

[52] U.S. Cl. .................................. 165/47, 165/80

[51] Int. Cl. .......................................... F24h 3/00

[58] Field of Search .............................. 165/47, 80

[56] References Cited

UNITED STATES PATENTS 3,275,921 9/1966 Fellendorf et al. ................. 165/80

*Primary Examiner*—Charles Sukalo
*Attorney*—Keith L. Zerschling et al.

[57] ABSTRACT

Apparatus is described for cooling one or more semiconductor devices, such as diodes or thyristors or transistors, with a liquid. The apparatus includes first and second heat-sink members positioned in electrical contact with electrodes of the semiconductor device. The heat-sink members have flow passages within them, and a manifold having at least one flow passage within it interconnects the flow passages in the heat-sink members. During the use of the semiconductor device, a liquid coolant is circulated through the flow passages in the manifold and heat-sink members to effect cooling of the device.

6 Claims, 5 Drawing Figures

COOLING APPARATUS FOR SEMICONDUCTOR DEVICES

BACKGROUND OF THE INVENTION

This invention relates to apparatus for cooling one or more semiconductor devices, each of which has anode and cathode electrodes, with a liquid. Water may be used as the liquid coolant.

There are many applications in which semiconductor devices, such as thyristors, diodes, and transistors, are used to control large currents in electrical circuits. Where such devices are used to control large currents, it is usually necessary to provide some means for dissipating heat developed within them during their conduction. Typically, a metal heat-sink having a finned structure or the like is placed in contact with one of the electrodes of the semiconductor device for this purpose. However, in some applications, the current levels are so great as to require additional cooling techniques for the semiconductor devices. For example, in some thyristor applications, a liquid coolant, usually water, is caused to flow into a flow passage contained within an electrically conductive heat-sink member positioned in electrical contact with one of the electrodes of the thyristor. Sometimes it is necessary not only to cool one electrode of the thyristor in this manner, but to cool both the anode and cathode electrodes of the thyristor.

In those situations in which more than one of the electrodes of a semiconductor device must be cooled with a liquid, it is desirable to employ a cooling system in which the liquid coolant flows from its supply source to one of the electrodes of the device and then to the other electrode, after which the liquid coolant is discharged to a return line or the like. However, when a semiconductor device is used in rectification or switching applications, electrical line voltages appear across its electrodes when it is nonconductive. A liquid coolant flowing from one of the electrodes to another electrode constitutes a shunt electrical path around the semiconductor device. If the conductivity of the liquid coolant is low, then this shunt path has little or no effect on the operation of the electrical circuit. On the other hand, where the conductivity of the liquid coolant is high and the liquid coolant flow path between electrodes is short, then there may be a deleterious effect on circuit operation.

In order to prevent the aforementioned deleterious effect, it has been past practice, particularly where water that may contain mineral and other impurities that increase its conductivity is used as the liquid coolant, to employ a long flow path for the liquid in the region extending between the electrodes of the semiconductor device. In the prior art practice, this long flow path has been obtained with a length of tubing or hose. For example, where 480 volts are applied across the electrodes of a thyristor during its nonconductive state and where water is used as the liquid coolant, it has been customary practice to connect a hose having a length of from 18 to 24 inches between the heat-sink members that are in electrical contact with the anode and cathode electrodes of the thyristor. Other long hoses usually are required to supply water to, and to return water from, the heat-sink members.

Semiconductor devices are usually located within an electrical control cabinet, and it may be appreciated that long hoses or tubes connected to the electrodes of these devices occupy considerable space and may easily come into physical contact with other components within the electrical cabinet. Unfortunately, hoses and tubes tend to deteriorate with time and may become quite conductive. Physical contact of the hoses or tubes with other components in an electrical cabinet then have very serious effects.

SUMMARY OF THE INVENTION

In accordance with the invention, apparatus for cooling electrodes of a semiconductor device with a liquid comprises a first heat-sink member, positioned in electrical contact with one of the devices electrodes and a second heat-sink member positioned in electrical contact with another electrode of the device. Both of the heat-sink members have flow passages extending through them to permit the liquid coolant to flow through them. A manifold made from electrically nonconductive material is attached to both of the heat-sink members and has a flow passage that permits the liquid to flow into the flow passage in one of the heat-sink members, then to flow through the flow passage in the manifold, and from there to flow into the flow passage in the other of the heat-sink members. The liquid then re-enters the manifold and is discharged from it. The flow passages in the manifold may be folded back and forth upon themselves in an accordian-like or pleated manner.

Preferably, the manifold is formed in two parts. One of the parts has open channels formed in it, and the other part, made from a sheet material, is bonded to the first part and is positioned on the first part to seal the open channels therein. This forms all or part of the manifold flow passages described above.

The manifold and associated heat-sink members may be used for the liquid cooling of more than one semiconductor device. For example, thyristors, such as silicon controlled-rectifiers, are frequently connected in inverse parallel, and it is possible to use a single manifold in conjunction with two heat-sink members for the liquid cooling of the anode and cathode electrodes of both of the thyristors.

The invention may be better understood by reference to the detailed description which follows and to the drawings.

DETAILED DESCRIPTION

The semiconductor cooling apparatus of the invention has particular utility when applied in connection with electrical circuitry for resistance welding equipment. The drawings illustrate an electrical circuit, which includes thyristors and thyristor cooling apparatus, that is frequently used in resistance welding applications.

Figure 1:
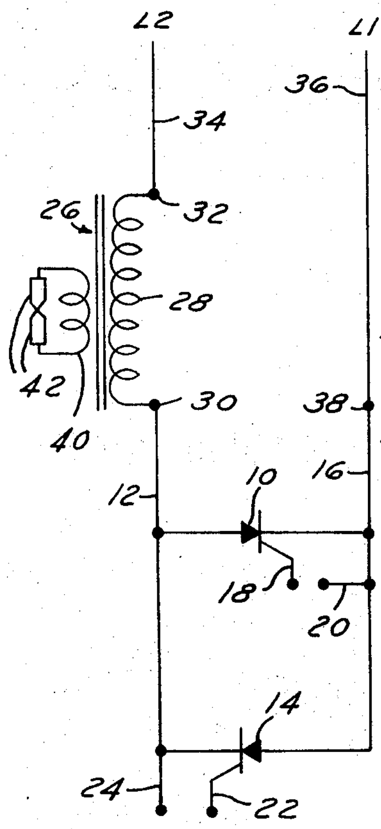
FIG. 1 is a schematic diagram of an electrical circuit that includes a pair of thyristors of the silicon controlled-rectifier type.

With particular reference now to the drawings, wherein like numerals refer to like parts, and in particular to FIG. 1, there is shown a schematic diagram of an electrical circuit which uses two thyristors in the form of silicon controlled-rectifiers (SCR's), the SCR's being connected in inverse parallel. Thus, an SCR 10 has its anode connected by a line 12 with the cathode of another SCR 14. Also, the cathode of the SCR 10 is connected to the anode of the SCR 14 by a line 16. The SCR 10 has a lead 18 connected to its gate electrode and another lead 20 facilitates application of a gate signal to the SCR 10. Similarly, the SCR 14 has a lead 22 connected to the line 12 to facilitate the application to the SCR 14 of a gate signal.

A transformer 26 is connected in series with the inverse parallel combination of the SCR's 10 and 14. The transformer 26 has one end of its primary winding 28 connected at 30 to the line 12 and has its other end connected at 32 to an alternating current voltage supply line 34. Another voltage supply line 36 is connected at terminal 38 to line 16. In resistance welding applications, the transformer 26 has its secondary winding 40 connected to welding electrodes 42. Also, the typical voltage appearing across the supply lines 34 and 36 is 480 volts AC.

In the operation of the circuit of FIG. 1, the inverse parallel combination of the SCR's 10 and 14 performs a switching function. Thus, if a gating pulse is applied to line 18 of the SCR 10 some time during the half cycle in which line 12 is positive with respect to line 16, then the SCR 10 will conduct. Similarly, a gating pulse applied to the gate lead 22 of the SCR 14 sometime during the half cycle during which the line 16 is positive with respect to the line 12 causes the SCR 14 to conduct. Thus, current can be made to flow through the primary winding 28 of the transformer 26 during all or selected portions of the half cycles of the supply line voltage as a result of gating pulses applied to the leads 18 and 22, respectively, of the SCR's 10 and 14. In resistance welding applications typical or those used in the automotive industry, the SCR's 10 and 14 may carry currents ranging from a low of about 800 amperes to a high of about 2,500 amperes. Such current levels generate considerable heat within the SCR's and liquid cooling is necessary.

With particular reference now to FIGS. 2 through 5, there is shown the portion of the electrical circuit of FIG. 1 including the SCR's 10 and 14, along with associated apparatus for the liquid cooling of the anode and cathode electrodes of these SCR's.

Figure 2:
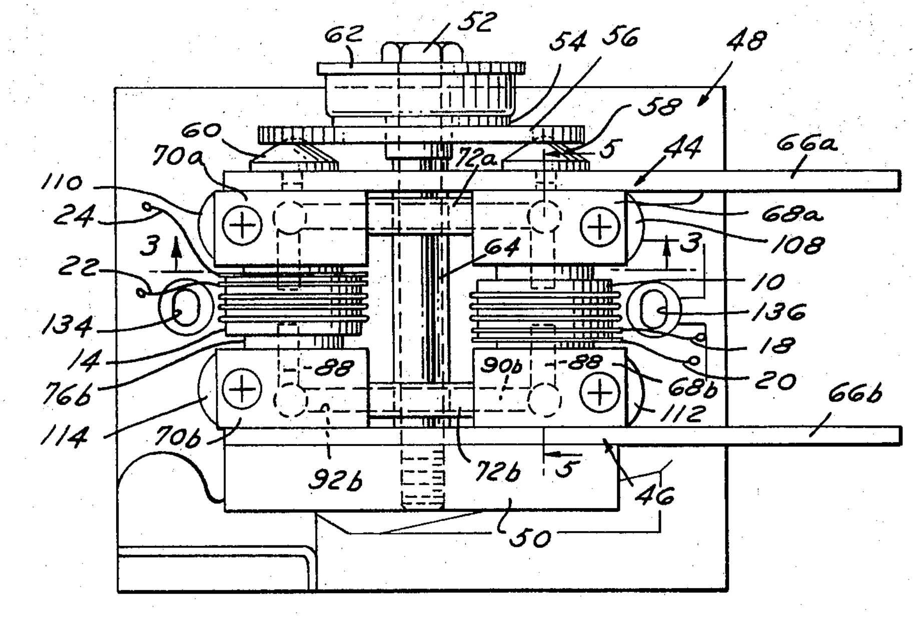
FIG. 2 is a reduced-scale plan view of silicon controlled-rectifiers electrically connected as shown in FIG. 1, together with apparatus constructed in accordance with the invention for cooling the thyristors with a liquid.
Figure 3:
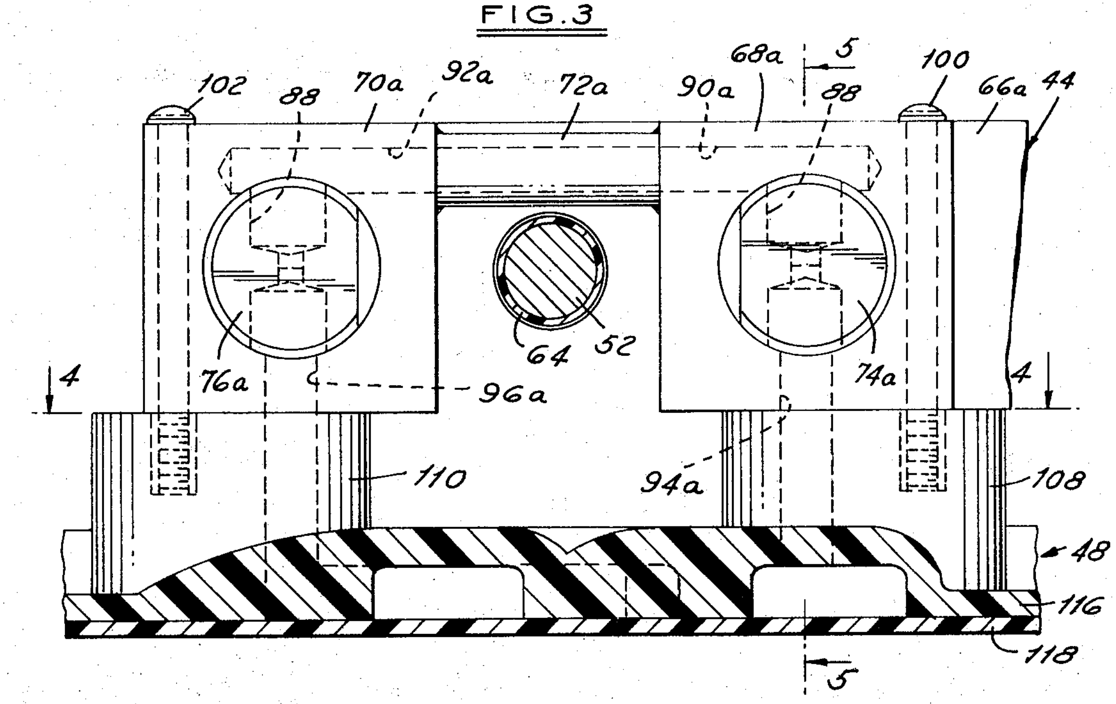
FIG. 3 is a reduced-scale partial sectional elevational view taken along the line 3—3 in FIG. 2.

The overall arrangement of the SCR's 10 and 14 and the associated cooling apparatus may best be seen in FIG. 2. The SCR cooling apparatus is comprised of a first heat-sink member generally designated by the numeral 44, a second heat-sink member generally designated by the numeral 46, and a manifold 48. The first heat-sink member 44 is made from a conductive material and is in electrical contact with the anode of the SCR 10 and with the cathode of the SCR 14. Therefore, the first heat-sink member 44 comprises all or part of the electrical line 12. Similarly, the second heat-sink member 46 is made from an electrically conductive material and is in electrical contact with the cathode of the SCR 10 and with the anode of the SCR 14. Therefore, the second heat-sink member 46 comprises all or part of the electrical line 16.

A large force is used to maintain the heat-sink members 44 and 46 in electrical contact with the SCR's 10 and 14. The means for obtaining this force comprises a force distribution plate 50, a bolt 52 threaded into the force distribution plate 50, a washer 54, another force distribution plate 56, and buttons 58 and 60 in contact with the force distribution plate 56. At its upper portion, the bolt 52 is electrically isolated from the first heat-sink member 44 by a cup-shaped insulator 62. The middle portion of the bolt 52 is electrically isolated from the first heat-sink member 44 by means of a tubular insulator 64 through which the bolt 52 passes. The amount of torque applied to the bolt 52 determines the force applied to the electrodes of the SCR's 10 and 14 through the force distribution plates 50 and 56 and the buttons 58 and 60.

The heat-sink members 44 and 46 are each comprised of six parts. These six parts are suitably affixed to one another and, for the first heat-sink member 44, include a bar **66*a* of rectangular cross-section, a pair of spaced blocks 68*a* and 70*a* attached to the bar 66*a*, a conduit 72*a* interconnecting the blocks 68*a* and 70*a* and cylindrical pieces 74*a* and 76*a* positioned, respectively, within openings in the blocks 68*a* and 70*a*. The second heat-sink member 46 has similar components which are designated by the numerals 66*b*, 68*b*, 70*b*, 72*b*, 74*b*, and 76*b***.

Figure 5:
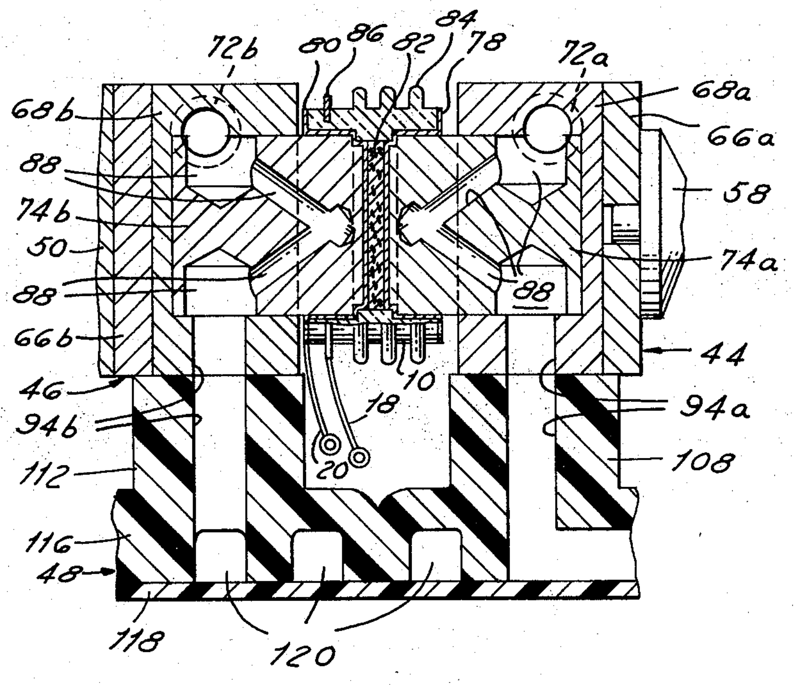
FIG. 5 is a full-scale partial sectional view of the apparatus of FIG. 2, the section being taken along the lines 5—5 indicated in both FIGS. 2 and 3.

The manner in which the heat-sink members 44 and 46 are constructed and held in electrical contact with the anode and cathode electrodes of the SCR's may best be seen in the sectional view of FIG. 5. It may be seen that the commercially available SCR 10 is comprised of a cup-shaped anode 78, a similarly cup-shaped cathode 80, and a PNPN semiconductor structure 82 positioned between the bases of the cup-shaped electrodes 78 and 80. A ribbed ceramic insulator 84 surrounds the semiconductor material and cup-shaped electrodes. A conductive ring 86 forms the gate electrode of the SCR 10 and is connected by means not shown to an appropriate point within the semiconductor material 82. The electrical leads 18 and 20 are connected, respectively, to the gate and cathode electrodes of the SCR. The cylindrical pieces **74*a* and 74*b* of the heat-sink members 44 and 46 are in electrical contact, respectively, with the cup-shaped electrodes 78 and 80**.

Each of the cylindrical pieces **74*a*, 76*a*, 74*b*, and 76*b* has a flow passage within it formed by four drilled and interconnected holes, which are collectively designated in each of the pieces by the numeral 88. The flow passages 88 in the cylindrical pieces 74*a* and 76*a* are interconnected by holes 90*a* and 92*a* formed, respectively, in the blocks 68*a* and 70*a* and by the conduit 72*a*, as may best be seen in FIG. 3. The blocks 68*b* and 70*b* have similar passages 90*b* and 92*b* formed in them. Thus, it is apparent that water or other liquid coolant may be made to flow through the heat-sink members 44 and 46 and that this water flows very near the electrodes 78 and 80 of the SCR's 10 and 14. The heat-sink member 44 has an inlet orifice 94*a* and an outlet orifice 96*a*. The heat-sink member 46 has an outlet orifice 94*b* and an inlet orifice 96*b***.

The heat-sink members 44 and 46 are attached to the manifold 48 with screws 100, 102, 104, and 106 which are threaded, respectively, in four bosses 108, 110, 112, and 114 which are integral with the manifold 48. Each of the bosses 108, 110, 112 and 114 has a flow passage within it which communicates with an inlet or outlet orifice in the heat-sink members 44 and 46. For convenience, the flow passages in the bosses that communicate with the heat-sink members are given the same numerical designations in the drawings as were the corresponding orifices in the heat-sink members, that is, they are numbered 94*a*, 96*a*, 94*b*, and 96*b*.

Figure 4:
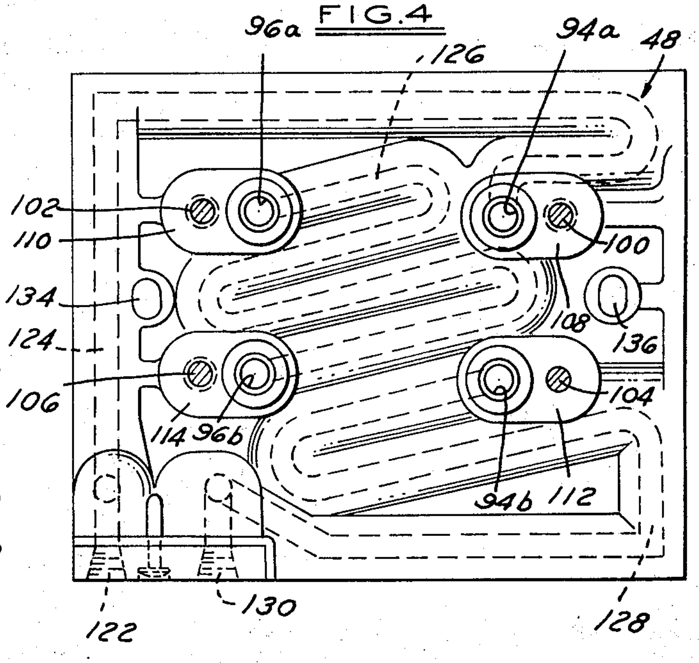
FIG. 4 is a reduced-scale sectional view of the apparatus of FIG. 2, the section being taken along the line 4—4 of FIG. 3.

The construction of the manifold 48 may best be seen in FIGS. 4 and 5. Preferably, it comprises two pieces 116 and 118 made from suitable nonconductive materials. Preferably, the manifold piece 116 is made from a molded plastic material and has a plurality of open U-shaped channels 120 formed in it. The manifold piece 118 may then be made from a plastic sheet material that is bonded to the manifold piece 116 in such position as to close the open U-shaped channels 120 to form flow passages in the manifold 48.

The preferred arrangement for the flow passages in the manifold 48 may best be described in connection with FIG. 4 in which the flow passages appear as broken lines. Water or other liquid coolant enters the manifold 48 through an inlet port 122 and flows along a flow passage 124 until it enters the inlet orifice 94*a* of the first heat-sink member 44. The water within the heat-sink member 44 passes through its flow passage formed in the block 68*a*, the cylindrical piece 74*a*, the conduit 72*a*, the block 70*a*, and the cylindrical piece 76*a*. The water then flows through the outlet orifice 96*a* in the first heat-sink member 44 and into the correspondingly designated flow passage in the manifold boss 110. The water then enters a flow passage 126, which is a long and compact flow passage that is folded back and forth upon itself in an accordian-like or pleated manner. After the water has flowed through the passage 126, it enters the inlet orifice of the second heat-sink member 46 through the flow passage 96*b* in the manifold boss 114. The water then flows through the heat-sink member 46 and into the flow passage 94*b* in the manifold boss 112. A flow passage 128 then conducts the water to a discharge port 130.

From the above, it is apparent that long flow passages 124, 126, and 128 are provided in the manifold 48. Thus, the water at the inlet port 122 of the manifold is substantially isolated in an electrical sense from the water in electrical contact with the heat-sink member 44; the water in electrical contact with the heat-sink member 44 is electrically isolated by the long flow passage 126 from the water in electrical contact with the heat-sink member 46; and the water in the heat-sink member 46 is electrically isolated by the long flow passage 128 from the water at the manifold discharge port 130. Of course, the direction of the water flow through the manifold 48 and the heat-sink members 44 and 46 may be reversed.

Conveniently, the manifold 48 is provided with a pair of holes 134 and 136 by means of which the manifold and heat-sink member assembly may be attached to a control cabinet.

The detailed description of the invention has been limited to cooling apparatus for use with thyristors. However, the inventive concept of employing a pair of heat-sink members with a flow manifold interconnecting them may be applied to cooling applications for other types of semiconductor devices, such as rectifiers and power transistors. The exact design of the flow manifold, including the size and length of its flow passages, necessarily depends upon the voltage and current levels to be encountered, the power dissipation of the device, the kind of liquid coolant to be used and its flow rate, etc.

Based upon the foregoing description of the invention, what is claimed and desired to be protected by Letters Patent is:

1. Apparatus for cooling a semiconductor device with a liquid, said device having anode and cathode electrodes, which apparatus comprises: a first heat-sink member positioned in electrical contact with one of said electrodes, said first heat-sink member having a flow passage extending therethrough to permit said liquid to flow therethrough; a second heat-sink member positioned in electrical contact with the other of said electrodes, said second heat-sink member having a flow passage therethrough to permit said liquid to flow therethrough; and a manifold for conducting said liquid to and away from said flow passages in said first and second heat-sink members, said first and second heat-sink members being mounted on said manifold, said manifold being made from electrically nonconductive material, said manifold comprising a first piece having at least one open channel formed therein, a second piece bonded to said first piece, said second piece being made from a sheet material and being positioned on said first piece to seal said open channel in said first piece, thereby, to form closed passages through which said liquid can be made to flow, said manifold having an inlet port for receiving said liquid and a first flow passage extending from said inlet port to said first heat-sink member flow passage, said manifold having a second flow passage interconnecting said flow passages in said first and second heat-sink members, and said manifold having a third flow passage extending from said second heat-sink member flow passage to a discharge port for the discharge of said liquid from said manifold.

2. Apparatus in accordance with claim 1, wherein said second flow passage interconnecting said flow passages in said first and second heat-sink members is folded back and forth upon itself.

3. Apparatus in accordance with claim 1, wherein said first piece of said manifold further includes a plurality of bosses, said bosses containing flow passages, and said first and second heat-sink members being attached to said bosses.

4. Apparatus in accordance with claim 3, wherein said second flow passage interconnecting said flow passages in said first and second heat-sink members is folded back and forth upon itself.

5. Apparatus for cooling a semiconductor device with a liquid, said device having anode and cathode electrodes, which apparatus comprises: a first heat-sink member positioned in electrical contact with one of said electrodes; a second heat-sink member positioned in electrical contact with another of said electrodes; and a manifold attached to said first and second heat-sink members;said manifold being formed from two pieces each of which is made from a nonconductive material, one of said pieces having a plurality of U-shaped open channels therein, the other piece of said manifold being made from a sheet material bonded to said first manifold piece, said sheet material being positioned on said first manifold piece to close said U-shaped open channels in said first piece, thereby, to form closed flow passages therein.

6. Apparatus in accordance with claim 5, wherein at least one of said channels in said one manifold piece is folded back and forth upon itself in an accordian-like or pleated manner.

* * * * *